(12) United States Patent
Everitt et al.

(10) Patent No.: US 6,577,695 B1
(45) Date of Patent: Jun. 10, 2003

(54) EMULATING NARROW BAND PHASE-LOCKED LOOP BEHAVIOR ON A WIDE BAND PHASE-LOCKED LOOP

(75) Inventors: James Everitt, Granite Bay, CA (US); James Parker, Rancho Cordova, CA (US)

(73) Assignee: Level One Communications, Sacramento, CA (US)

( * ) Notice: Subject to any disclaimer, the term of this patent is extended or adjusted under 35 U.S.C. 154(b) by 0 days.

(21) Appl. No.: 09/526,794

(22) Filed: Mar. 4, 1997

(51) Int. Cl.[7] .................................................. H03D 3/24
(52) U.S. Cl. ...................... 375/375; 375/376; 327/145; 327/147; 327/156; 327/163; 331/25
(58) Field of Search ................................. 375/375, 376; 331/11, 16, 17, 25, 163; 327/150, 151, 156, 159, 145, 147

(56) References Cited

U.S. PATENT DOCUMENTS

| | | | | |
|---|---|---|---|---|
| 4,787,097 A | * | 11/1988 | Rizzo | ........................ 327/156 |
| 4,942,370 A | * | 7/1990 | Shigemori | .................... 331/1 A |
| 5,446,416 A | * | 8/1995 | Lin et al. | ....................... 331/11 |
| 5,465,277 A | * | 11/1995 | Schreurs et al. | ............ 375/375 |
| 5,525,935 A | * | 6/1996 | Joo et al. | ..................... 327/156 |
| 6,031,428 A | * | 2/2000 | Hill | ............................. 327/156 |

\* cited by examiner

Primary Examiner—Amanda T. Le
(74) Attorney, Agent, or Firm—Merchant & Gould P.C.

(57) ABSTRACT

A phase-locked loop circuit for providing a tightly controlled capture range for locking an output signal to a data signal, while also providing a wide frequency capture range for initially pulling the output signal within this narrow, predetermined frequency range. The apparatus detects a frequency difference between at least one reference signal and an output signal, and generates a frequency error signal in response to the frequency difference. A phase difference is detected between a received input signal and the output signal, and a phase error signal is generated in response to the phase difference. The frequency error signal and the phase error signal are combined to control the frequency of the output signal by controlling an input-controlled oscillator.

24 Claims, 4 Drawing Sheets

EMULATING NARROW BAND PHASE-LOCKED LOOP BEHAVIOR ON A WIDE BAND PHASE-LOCKED LOOP

BACKGROUND OF THE INVENTION

1. Field of the Invention

The present invention relates generally to phase-locked loop circuits, and more particularly to a phase-locked loop circuit which exhibits a tightly controlled capture range for locking an output signal to a data signal, while also providing a wide frequency capture range for initially pulling the output signal within this narrow, predetermined frequency range.

2. Description of Related Art

Digital data transmission has become increasingly important in the modern communications era. The importance of modern digital data transmission drives the search for more efficient and effective phase-locked loops that are used in data communications systems.

FIG. 1 illustrates a prior art phase-locked loop (PLL) 10 feedback circuit. The PLL 10 is a feedback circuit that is often used to reduce an error term toward zero. In the case of the PLL, the error term is the phase difference between an input signal and a reference signal. The basic component building blocks of a PLL are a phase comparator 12 and an input-controlled oscillator (ICO) 14. The PLL incorporates the ICO 14 in the feedback loop. An ICO is an oscillator whose output frequency is a function of its input. The phase comparator 12 compares the phase of the input signal on line 16 to the phase of the signal at the output of the ICO on line 18. If the phase difference between these two signals is non-zero, the output frequency of the ICO 14 is adjusted in a manner which forces this difference towards zero. The output signal on line 20 is fed back to the ICO 14 to provide a signal that is related to the phase difference between the signals on lines 16 and 18.

As is appreciated by those skilled in the art, such a PLL feedback system is often used to extract a baseband signal from a frequency modulated carrier in a communications system. Phase-locked loops are also widely used in communication systems for coherent carrier tracking, bit synchronization and symbol synchronization. The PLLs as used in the data communications system of the present invention are used to lock to a receive signal and to subsequently provide the receive clock for that signal. Typically, the PLL lock information generated from a data signal is poor, and is therefore not capable of pulling the PLL very far in frequency. Often the frequency range of the PLL is wider than this narrow "capture" range. Under these circumstances, the oscillation frequency of the PLL must somehow be brought close enough to the data signal frequency for the PLL to lock to the data signal. This can be done, as shown in FIG. 1, by first locking the PLL 10 to the frequency of a reference signal on line 22, which is close in frequency to the data signal on line 24. When the PLL 10 is locked to the reference signal on line 22, the input of the PLL 10 is switched over to the data signal on line 24. Although this procedure works, it requires control circuitry 26 to switch from the reference signal on line 22 to the data signal on line 24, and then back again if phase lock is lost.

There is a need, therefore, for a phase-locked loop which has a wide frequency capture range for pulling the PLL within a predetermined frequency range, yet has a well-controlled and narrow frequency capture range for locking to the actual data signal, without the use of switching control circuitry such as control circuitry 26.

SUMMARY OF THE INVENTION

To overcome the limitations in the prior art described above, and to overcome other limitations that will become apparent upon reading and understanding the present specification, the present invention discloses a phase-locked loop that exhibits a tightly controlled capture range for locking an output signal to a data signal, while also providing a wide frequency capture range for initially pulling the output signal within this narrow, predetermined frequency range.

The apparatus detects a frequency difference between at least one reference signal and a phase-locked loop (PLL) output signal, and generates a frequency error signal in response to the frequency difference. A phase difference is detected between a received input signal and the PLL output signal, and a phase error signal is generated in response to this phase difference. The frequency error signal and the phase error signal are combined, and this combined signal controls the frequency of the output signal.

One aspect of the invention is that the frequency error signal dominates the concurrently generated phase error signal when the frequency difference is outside of a predetermined frequency range. This dominating signal overdrives the phase error signal when the controlled oscillator frequency is outside of the predetermined frequency range.

In another embodiment of the present invention, a multiple-stage phase-locked loop (PLL) has an inherently wide actual frequency range and a narrow effective signal capture range. The PLL includes a first detection mechanism for detecting first phase differences between reference clocks and an output signal, and for generating a first phase error signal when the first phase differences fall outside of a predetermined frequency range. The PLL further includes a second detection mechanism for detecting second phase differences between a received input signal and the output signal, and for generating a second phase error signal in response thereto. A signal summing mechanism combines the first phase error signal and the second phase error signal, and allows the first phase error signal to overdrive the second phase error signal when both the first and second phase error signals are active. The PLL also includes an input-controlled oscillator to control the frequency of the output signal in response to the first and second phase error signals.

In yet another embodiment of the invention, a method is provided for phase-locking an output signal to a data signal. A frequency error signal is generated where a first frequency difference, measured by the frequency difference between a reference signal and the output signal, is outside of a predetermined frequency range. A phase error signal is generated for a second frequency difference measured by the frequency difference between the data signal and the output signal. Where the first frequency difference is outside of the predetermined frequency range, the frequency error signal overdrives the phase error signal. The frequency of the output signal is controlled with the phase error signal and the frequency error signal.

These and various other advantages and features of novelty which characterize the invention or point out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized and structural changes may be made without departing from the scope of the present invention.

The present invention provides a phase-locked loop circuit which exhibits a tightly controlled capture range for locking to a data signal, by also providing a wide frequency capture range for pulling the PLL to within this narrow capture range.

Figure 1:
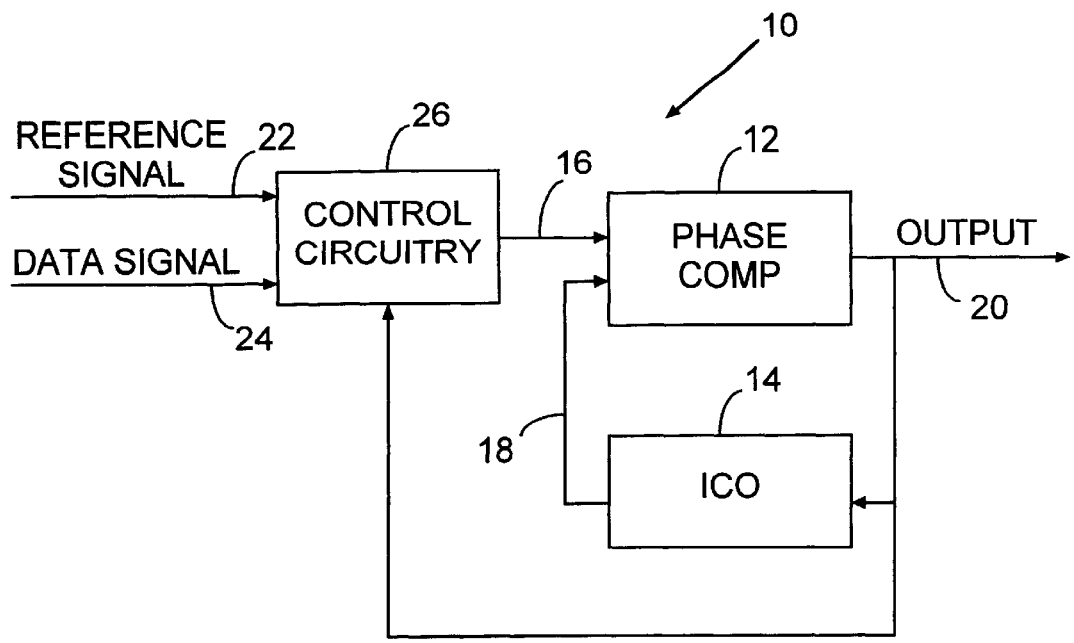
FIG. 1 illustrates a prior art phase-locked loop feedback circuit.
Figure 2:
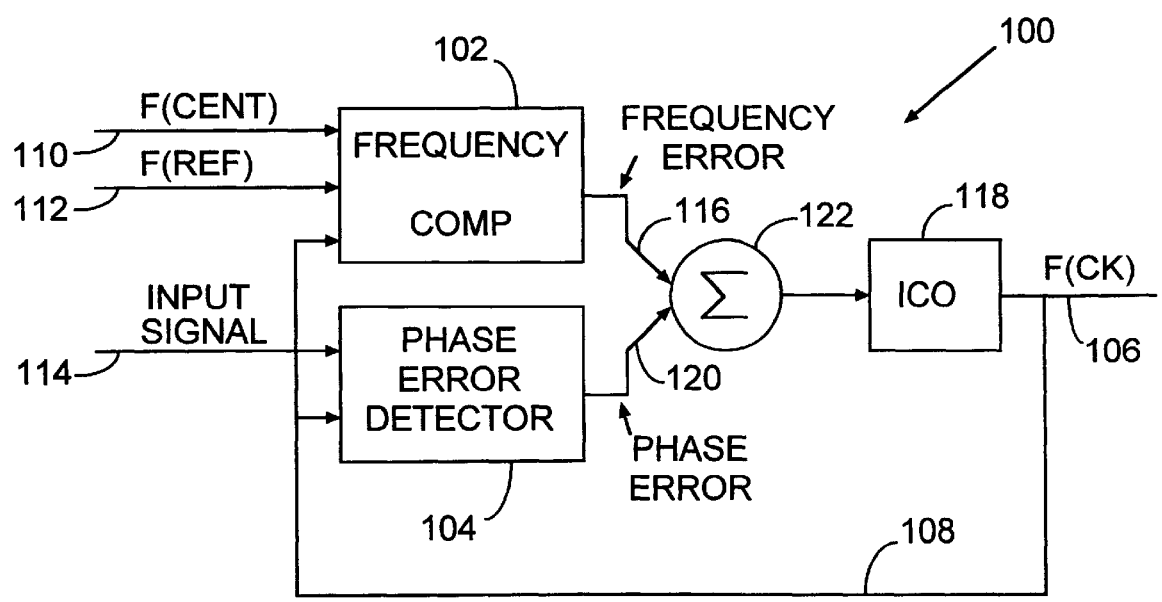
FIG. 2 is a general block diagram of one embodiment of the phase-locked loop of the present invention.

FIG. 2 is a general block diagram of one embodiment of the invention. The PLL 100 of FIG. 2 includes a frequency comparator 102 and a phase error detector 104 at the inputs of the PLL 100. The frequency comparator 102 compares the frequency of one or more reference signals to the frequency of a signal to be controlled. The signal to be controlled in FIG. 2 is the output signal, labeled F(CK) on line 106. The F(CK) signal is fed back to the frequency comparator 102 via line 108 to be compared to one or more reference signals. In the preferred embodiment, two reference signals are provided, labeled F(CENT) on line 110 and F(REF) on line 112. PLL 100 compares the frequency of the F(CK) signal on feedback line 108 to a combination of the reference signals on lines 110 and 112. The reference signal combination will be described in more detail in the ensuing description.

The purpose of the frequency comparator 102 is to provide a mechanism for pulling the output of the PLL 100 within a first frequency range from which the phase error detector 104 can then tightly lock to the input signal on line 114. The frequency comparator 102 outputs a frequency error on line 116 that is proportional to the frequency difference between the combination of the reference clock signals on lines 110, 112, and the F(CK) signal on feedback line 108. Where the frequency of the F(CK) signal on feedback line 108 is greater than F(CENT)+F(REF), a negative frequency error signal will be generated on line 116 to ultimately cause the input-controlled oscillator 118 (e.g., current or voltage) to decrease the frequency of the F(CK) signal. Where the frequency of the F(CK) signal on feedback line 108 is less than F(REF)−F(CENT), a positive frequency error signal will be generated on line 116 to ultimately cause the input-controlled oscillator 118 to increase the frequency of the F(CK) signal.

The frequency comparator 102 and the phase error detector 104 operate concurrently, however the frequency comparator 102 overrides the phase error detector 104 while the frequency error on line 116 is active. The frequency error is active when the frequency difference, between the F(CK) signal on feedback line 108 and the combination of the reference signals F(CENT) and F(REF) on lines 110 and 112 respectively, is outside of a predetermined frequency range.

This predetermined frequency range is bounded by a cutoff frequency, F(cutoff), above or below the combined reference signal frequency. When the frequency difference is within the predetermined frequency range, the phase error on line 120 is recognized by the input-controlled oscillator 118, which then adjusts the output signal F(CK) on line 106 according to the frequency difference between the F(CK) signal on feedback line 108 and the input signal on line 114. In sum, the frequency comparator 102 first pulls the PLL 100 output signal F(CK) on line 106 to a frequency range defined by the reference signals F(CENT) and F(REF) on lines 110 and 112 respectively. Then, when the F(CK) signal is within the predetermined frequency range, the phase error detector locks the PLL 100 output signal F(CK) to the input signal on line 114.

As previously described, the frequency comparator 102 overrides the phase error detector 104 when the frequency comparator 102 is generating a frequency error signal on line 116. The amplitude of the frequency comparator 102 output on line 116 is selected to be large enough to overdrive the phase error signal on line 120. Therefore, when the frequency difference between the F(CK) signal and the combination of the reference signals F(CENT) and F(REF) is outside of the predetermined frequency range, the frequency comparator 102 provides an amplified error signal which is recognized at the input of the input-controlled oscillator 118.

When this frequency difference is within the predetermined frequency range, the amplified frequency error signal on line 116 is reduced to a near zero value, and the phase error detector 104 then provides the error signal to the input of the input-controlled oscillator 118. Using such an amplified frequency error signal, both the frequency error signal and the phase error signal, on lines 116 and 120 respectively, can be concurrently generated, while allowing only one of the signals to be significantly recognized.

The frequency error signal and the phase error signal on lines 116 and 120 are added together at the summing device 122. This allows both the frequency error signal and the phase error signal to be generated concurrently, while providing a single input signal to the input-controlled oscillator 118.

Figure 3:
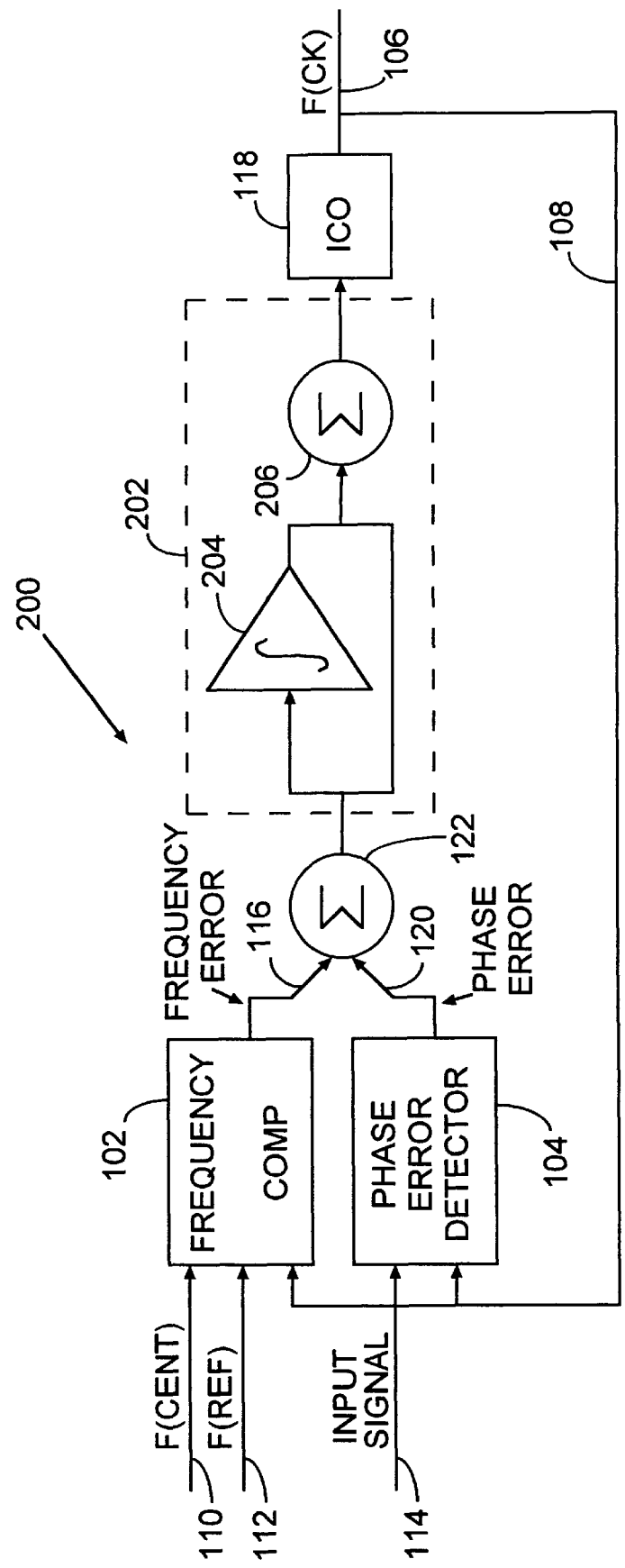
FIG. 3 is a block diagram of a second order phase-locked loop of the present invention.

Referring now to FIG. 3, the PLL 200 includes a circuit 202 for changing the order of the phase-locked loop. The PLL 200 is similar to PLL 100 of FIG. 2, as it includes the frequency comparator 102, the phase error detector 104, the summing circuit 122 and the input-controlled oscillator 118. However, these components can be applied to any order PLL. PLL 200 is a second order phase-locked loop, as the circuit 202 includes an integrator 204 and a summing circuit 206. As will be appreciated by those skilled in the art, the inclusion of circuit 202 results in a transfer function having two poles, thereby providing a second-order PLL. Regardless of the order of the PLL, the resulting signal acts as input to the input-controlled oscillator 118 to control the frequency of the output signal F(CK) on line 106. The output signal F(CK) is also fed back into both the frequency comparator 102 and the phase error detector 104. This feedback provides the control signal necessary for the frequency comparator 102 and the phase error detector 104 to lock to the frequency of the input signal on line 114. Any order PLL can be constructed using the teachings as herein disclosed without departing from the scope and spirit of the invention.

Figure 4:
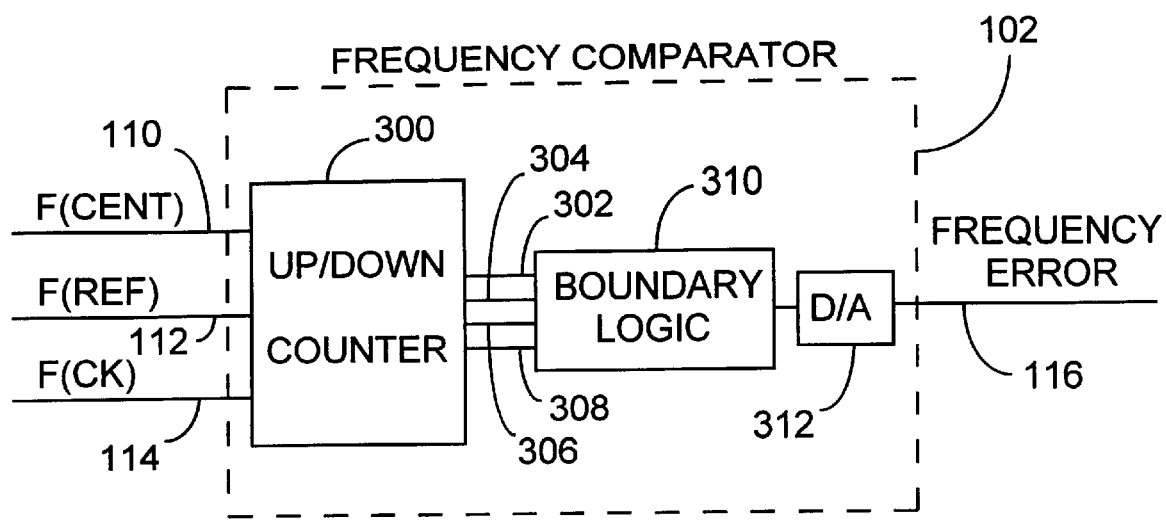
FIG. 4 is a block diagram of one embodiment of the frequency comparator.

FIG. 4 is a general block diagram of one embodiment of the frequency comparator 102. The preferred frequency comparator 102 is an up/down counter 300 with input signals F(CENT), F(REF) and F(CK) on lines 110, 112 and 114. One possible implementation is a 4-bit counter having four outputs on lines 302, 304, 306 and 308. On the positive edge of an F(CENT) pulse, the counter executes one count towards its center (i.e., it decrements the count if the count is greater than eight, and increments the count if the count is less than eight). On the positive edge of an F(REF) pulse the counter increments, and on the positive edge of an F(CK) pulse the counter decrements.

When the count is greater than 12, the frequency comparator 102 outputs a positive error signal proportional to the amount by which the count is greater than or equal to twelve (hexadecimal C). When the count is less than 4, the frequency comparator 102 outputs a negative error signal proportional to the amount by which the count is less than four.

Other circuitry in the frequency comparator 102 converts the up/down counter 300 value to a signal that can be recognized by the input-controlled oscillator 118. For instance, the boundary logic 310 receives the count value on lines 302 through 308, and determines whether the count is less than four, between four and eleven, or greater than or equal to twelve. If the count is between four and eleven, the boundary logic 310 outputs a binary null value to ultimately generate a near zero frequency error signal on line 116. If the count is less than four, or greater than eleven, the boundary logic passes the value to a digital-to-analog (D/A) converter 312 that generates a proportional frequency error signal on line 116.

It can be shown that the up/down counter 300 counts down and therefore produces a negative frequency error signal when F(CK)−F(REF)>F(CENT), which would indicate that the F(CK) signal is oscillating at a faster rate than the F(REF) and F(CENT) reference signal combination. The up/down counter 300 counts up and therefore produces a positive frequency error signal when F(CK)−F(REF)<−F(CENT), which would indicate that the F(CK) signal is oscillating at a slower rate than the F(REF) and F(CENT) reference signal combination. The up/down counter 300 counts toward the center and therefore produces zero output when |F(CK)−F(REF)|<F(CENT). This indicates that the zone where the frequency comparator 102 no longer overdrives the phase error signal on line 120 is within the predetermined frequency range defined by F(REF)−F(CENT) to F(REF)+F(CENT). Since F(REF) and F(CENT) are crystal controlled clocks in the preferred embodiment, the capture range is tightly controlled and can be made very narrow. This result is independent of the exact counter details implemented.

Referring now to Table 1, the frequency comparator 102 output, i.e., the frequency error signal on line 116, is shown for each count of a 4-bit up/down counter 300. As can be seen, a negative frequency error signal, labeled −ERR, is generated for binary values of 0 to 3. The −ERR signal is proportional to the amount by which the count is less than four. The +ERR signal is proportional to the amount by which the count is greater than or equal to twelve. Where the count is between four and eleven, the frequency error signal, shown as ERR, is equal to zero.

TABLE 1

| COUNTER OUTPUT | REQUENCY COMPARATOR OUTPUT |
|---|---|
| 0 0 0 0 | −ERR ∝ (4-COUNT) |
| 0 0 0 1 | |
| 0 0 1 0 | |
| 0 0 1 1 | |
| 0 1 0 0 | ERR = 0 |
| 0 1 0 1 | |
| 0 1 1 0 | |
| 0 1 1 1 | |
| 1 0 0 0 | |
| 1 0 0 1 | |
| 1 0 1 0 | |
| 1 0 1 1 | |
| 1 1 0 0 | +ERR ∝ (COUNT-12) |
| 1 1 0 1 | |
| 1 1 1 0 | |
| 1 1 1 1 | |

Figure 5:
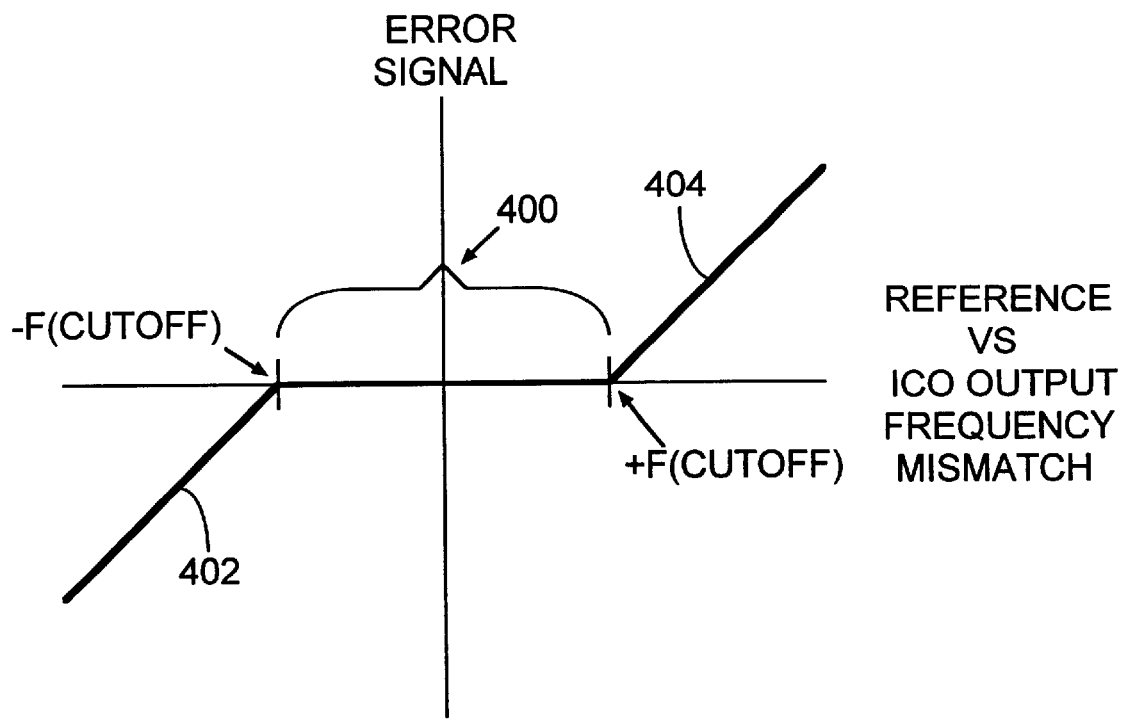
FIG. 5 is a general diagram of the transfer function of the frequency comparator.

FIG. 5 is a diagram of the transfer function of the frequency comparator 102 of FIG. 4. FIG. 5 illustrates the frequency error signal on line 116 as plotted against the frequency mismatch of the reference signals and the VCO 118 output. As is evident from FIG. 5, where the reference signals and the input-controlled oscillator output are relatively close in frequency, no error signal is generated by the frequency comparator 102 within the predetermined frequency range 400. It is within this frequency range 400 that the frequency error on line 116 does not dominate the phase error signal on line 120, and the phase error signal allows the input signal on line 114 to be locked as the F(CK) signal on line 106. The lower range of the frequency mismatch is shown in FIG. 5 as the minus cutoff frequency, −F(CUTOFF), and the upper range of the frequency mismatch is shown as the positive cutoff frequency, +F(CUTOFF). These cutoff frequencies define the boundaries of the predetermined frequency range outside of which the frequency error signal controls. At mismatch frequencies below the minus cutoff frequency, it can be seen that a negative error signal is generated which is proportional to the magnitude of the frequency mismatch. Likewise, frequency mismatches above the positive cutoff frequency increase linearly as the frequency mismatch increases beyond its upper range.

For the frequency comparator 102 as shown in FIG. 4, the up/down counter 300 will decrement the count when the F(CK) signal is greater than the sum of the reference signals as shown in Equation 1 below.

$$F_{(CK)} > F_{(REF)} + F_{(CENT)} \qquad \text{[EQUATION 1]}$$

When the F(CK) signal is greater than the sum of the reference signals, the operating point moves to the left on the transfer function of FIG. 5 until a negative error signal occurs, which is proportional to the magnitude of the frequency mismatch, as seen by line 402.

The up/down counter 300 will increment the count when the F(CK) signal is less than the difference of the F(REF) and F(CENT) signals as shown in Equation 2 below.

$$F_{(CK)} < F_{(REF)} - F_{(CENT)} \quad \text{[EQUATION 2]}$$

When the F(CK) signal is less than the difference of the F(REF) and F(CENT) signals, the operating point moves to the right on the transfer function until a positive error signal occurs, which is proportional to the magnitude of the frequency mismatch, as seen by line 404.

When the magnitude of the difference between the F(CK) and F(REF) signals is less than the frequency of F(CENT), as shown in Equation 3 below, the operating point stays within the predetermined frequency range 400.

$$F_{(CENT)} > |F_{(CK)} - F_{(REF)}| \quad \text{[EQUATION 3]}$$

It will be readily recognized by those skilled in the art that counters larger or smaller than a 4-bit counter may be used without departing from the invention, and only the precise location of the −F(CUTOFF) and the +F(CUTOFF) will be affected.

Figure 6:
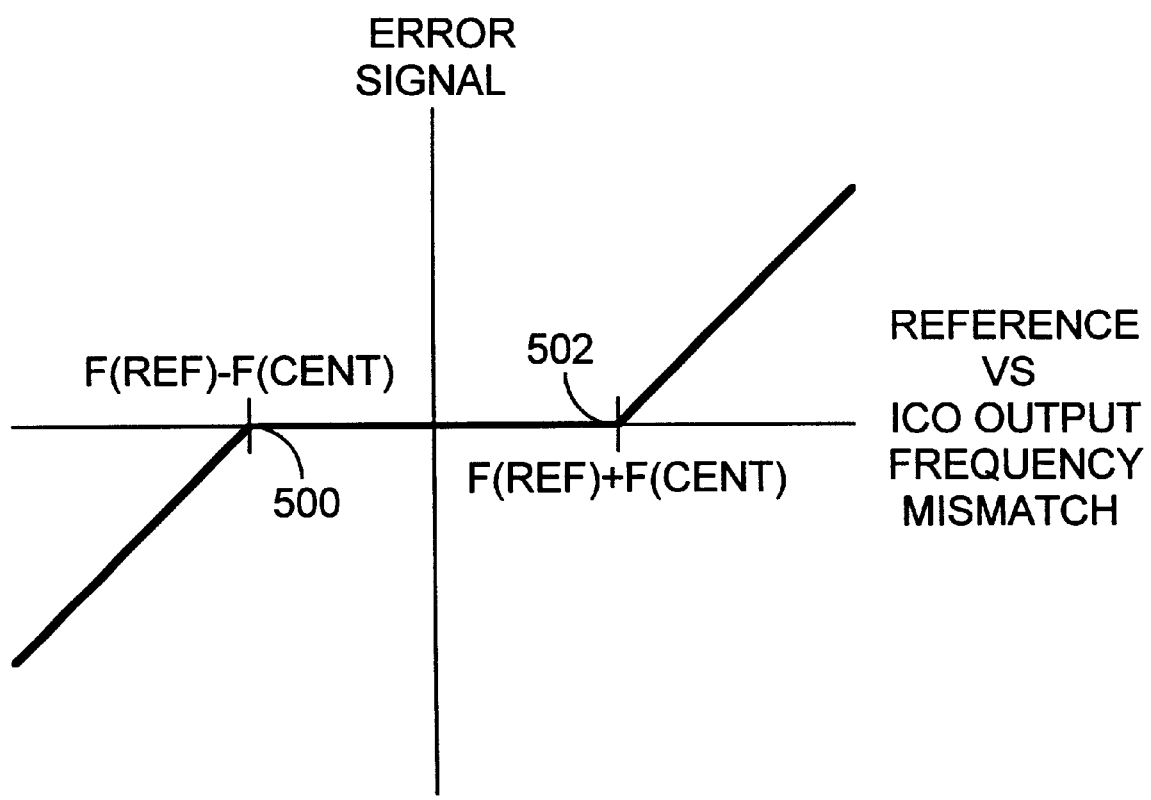
FIG. 6 is a diagram of the transfer function of the frequency comparator with respect to the preferred reference signals.

Referring now to FIG. 6, a diagram of the transfer function of the frequency comparator 102 is shown having the frequency cutoff values as determined by Equations 1 and 2. The −F(CUTOFF) frequency, shown at point 500, can be represented by F(REF)−F(CENT), as shown in Equation 2. The +F(CUTOFF) frequency, shown at point 502, can be represented by F(REF)+F(CENT), as shown in Equation 1. Therefore, the capture range is set by controlling the frequencies of the F(REF) and F(CENT) signals. By using crystal controlled signals, this range can be tightly controlled.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A phase-locked loop (PLL), comprising:
   frequency compare means for detecting a frequency difference between a PLL output signal and a combination of a first and a second reference signal, and for generating a frequency error signal in response thereto;
   phase error detection means for detecting a phase difference between a received input signal and the PLL output signal, and for generating a phase error signal in response thereto;
   signal summing means, coupled to the phase error detection means and the frequency compare means, for combining the phase error signal and the frequency error signal to form a combined error signal, wherein the frequency compare means increases the amplitude of the frequency error signal to create a frequency error signal that overdrives the phase error signal when the frequency difference is outside of a predetermined frequency range; and
   a input-controlled oscillator having an input terminal coupled to receive the combined error signal and an output terminal to output the PLL in response thereto.

2. The phase-locked loop as in claim 1, wherein the amplitude of the frequency error signal is increased so that it overdrives the phase error signal.

3. The phase-locked loop as in claim 1, wherein the frequency compare means comprises an up/down counter for detecting when the variable PLL output signal is outside a predetermined frequency range.

4. The phase-locked loop as in claim 1, wherein the frequency compare means comprises means for detecting the frequency difference in a first frequency range, and wherein the phase error detection means comprises means for detecting the phase difference when the frequency difference is within the first frequency range.

5. The phase-locked loop as in claim 1, wherein:
   a frequency variance between the combination of the two reference signals and the PLL output signal defines a frequency variance range; and
   the frequency error signal is recognized by the signal summing means when the frequency variance is beyond the frequency variance range, and the phase error signal is recognized by the signal summing means when the frequency variance is within the frequency variance range.

6. The phase-locked loop as in claim 1, further comprising an integrator coupled between the signal summing means and the input-controlled oscillator to provide a second-order PLL.

7. The phase-locked loop as in claim 1, wherein the frequency compare means, the phase error detection means, the signal summing means, and the input-controlled oscillator are applied to any order PLL.

8. The phase-locked loop as in claim 1, wherein the magnitude of the frequency error signal is proportional to the magnitude of the frequency difference between the at least one reference signal and the PLL output signal.

9. The phase-locked loop as in claim 1, wherein:
   the frequency compare means comprises an n-bit counter having the at least one reference signal and the PLL output signal as inputs; and
   the value of the frequency error signal is dependent on the counter value.

10. A multiple-stage phase-locked loop (PLL) having an inherently wide actual signal capture range and a narrow effective signal capture range, the phase-locked loop comprising:
    first detection means for detecting frequency differences between an output signal and a combination of a first and a second reference signal, and for generating a frequency error signal when the frequency differences fall outside of a predetermined frequency range;
    second detection means for detecting second phase differences between a received input signal and the output signal, and for generating a phase error signal in response thereto;
    signal summing means, coupled to the first detection means and the second detection means, for combining the frequency error signal and the phase error signal, wherein the phase error signal is overdriven with the frequency error signal when both the frequency error signal and the phase error signal are active; and
    input-controlled oscillation means, coupled to the signal summing means, for controlling the frequency of the output signal in response to the frequency and phase error signals.

11. The multiple-stage phase-locked loop as in claim 10, wherein the first and second detection means detect the frequency and phase differences concurrently.

12. The multiple-stage phase-locked loop as in claim 10, wherein the first detection means comprises means for generating a dominating error signal by changing an amplitude of the frequency error signal.

13. The multiple-stage phase-locked loop as in claim 12, wherein the signal summing means comprises means for combining the dominating error signal and the phase error signal, and for overdriving the phase error signal with the dominating error signal.

14. The multiple-stage phase-locked loop as in claim 10, wherein the input-controlled oscillation means comprises means for first controlling the frequency of the output signal in response to the frequency error signal, and for subsequently controlling the frequency of the output signal in response to the phase error signal.

15. The multiple-stage phase-locked loop as in claim 10, wherein the first detection means, the second detection means, the signal summing means, and the input-controlled oscillation means are used in conjunction with any order PLL.

16. The multiple-stage phase-locked loop as in claim 10, wherein the magnitude of the frequency error signal is proportional to the magnitude of the frequency difference.

17. The multiple-stage phase-locked loop as in claim 10, wherein the first detection means comprises counting means for varying an up/down count based upon the frequency differences between the at least one reference signal and the output signal, and for generating the frequency error signal when the up/down count is outside of a predetermined count range which corresponds to the predetermined frequency range.

18. The multiple-stage phase-locked loop as in claim 17, wherein the counting means generates a positive first phase error signal when the up/down count is above an upper count of the predetermined count range.

19. The multiple-stage phase-locked loop as in claim 18, wherein the positive frequency error signal causes the frequency of the output signal to increase.

20. The multiple-stage phase-locked loop as in claim 17, wherein the counting means generates a negative first phase error signal when the up/down count is below a lower count of the predetermined count range.

21. The multiple-stage phase-locked loop as in claim 20, wherein the negative frequency error signal causes the frequency of the output signal to decrease.

22. A method for phase-locking an output signal to a data signal, comprising the steps of:

generating a frequency error signal where a frequency difference, measured by the frequency difference between the output signal and a plurality of frequency-regulated reference signals, is outside of a predetermined frequency range;

generating a phase error signal for a phase difference, measured by the phase difference between the data signal and the output signal;

overdriving the phase error signal with the frequency error signal when the frequency difference is outside of the predetermined frequency range; and controlling the frequency of the output signal with the phase error signal and the frequency error signal.

23. The method of claim 22, wherein the overdriving step comprises the step of increasing the amplitude of the frequency error signal to overdrive the phase error signal.

24. The method of claim 22, wherein the step of generating a frequency error signal comprises the steps of varying an up/down count based upon the frequency differences between the reference signal and the output signal, and for generating the frequency error signal when the up/down count is outside of a predetermined count range corresponding to the predetermined frequency range.

* * * * *